Figure 1:
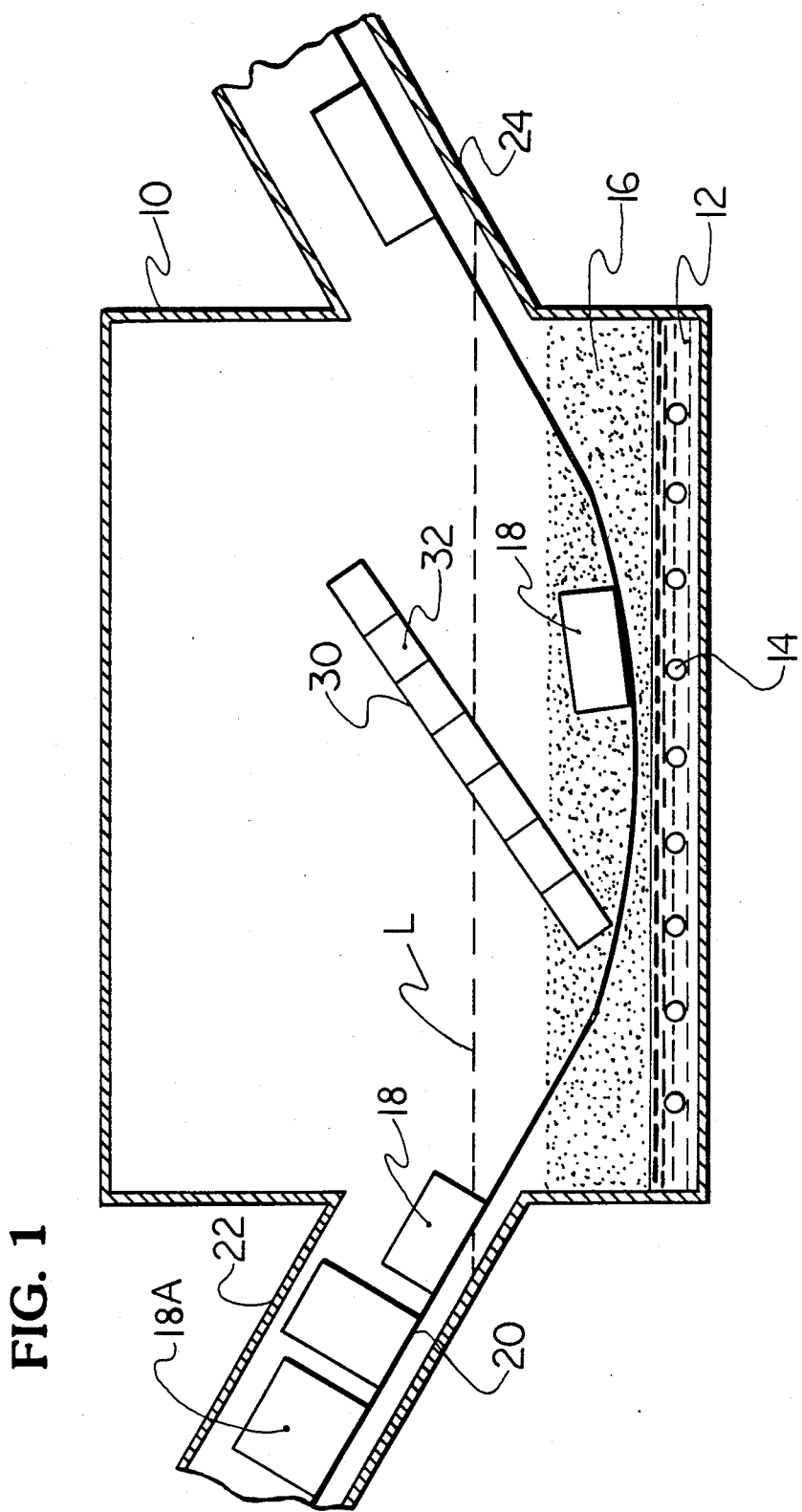

United States Patent [19]

Waldron

[11] Patent Number: 4,629,420

[45] Date of Patent: Dec. 16, 1986

[54] VAPOR LEVEL CONTROL FOR VAPOR PROCESSING SYSTEM

[75] Inventor: Gerald E. Waldron, Foxboro, Mass.

[73] Assignee: Dynapert-HTC Corp., Farmington, Conn.

[21] Appl. No.: 844,393

[22] Filed: Mar. 26, 1986

[51] Int. Cl.$^4$ ............................................. F27D 21/00
[52] U.S. Cl. ...................................... 432/32; 432/59; 432/8
[58] Field of Search ...................... 432/10–12, 432/18, 27, 32, 59, 161, 8; 122/4 D; 110/101 CD

[56] References Cited

U.S. PATENT DOCUMENTS

| | | | |
|---|---|---|---|
| 2,132,110 | 10/1938 | Holler | 432/10 |
| 3,965,855 | 6/1976 | Weiler | 432/59 |
| 4,155,965 | 5/1979 | Allada | 432/59 |
| 4,335,683 | 6/1982 | Criswell et al. | 122/4 D |
| 4,577,278 | 3/1986 | Shannon | 432/18 |

Primary Examiner—Henry C. Yuen
Attorney, Agent, or Firm—Spencer T. Smith

[57] ABSTRACT

A vapor processing system which has a vessel for containing a processing vapor generated by heating an electronic fluid contained within the vessel. A selected saturated vapor zone level is defined for work product delivered to the vapor zone by generating a signal representative of the actual temperature at one of a plurality of spaced locations, generating a signal representative of the desired temperature at the selected vertical location for a saturated vapor zone having a level selected for the work product being conveyed to the saturated vapor zone, generating data concerning product to be processed, and operating on the data for setting the means for generating a signal representative of the actual temperature and for setting the means for generating a signal representative of the desired temperature at the selected location, and comparing the generated signals representative of the actual and desired temperatures at the selected location and varying the output of the heater to change the actual sensed temperature to the desired temperature so that the actual saturated vapor zone level will conform to the desired saturated vapor zone level.

4 Claims, 2 Drawing Figures

VAPOR LEVEL CONTROL FOR VAPOR PROCESSING SYSTEM

In a vapor phase processing system, a contained electronic fluid is heated by heaters located within the contained fluid to generate a zone of saturated vapor. Work product is delivered to the saturated vapor zone and is retained within this zone until processing (soldering, for example) is completed.

It is an object of the present invention to generate data concerning work product being delivered to the saturated vapor zone and to utilize this data to control the power to the electronic fluid heaters to either raise or lower the level of the vapor to the minimum level required to properly process the work product.

Other objects and advantages of the present invention will become apparent from the following portion of the specification and from the following drawings which illustrate in accordance with the mandate of the patent statutes a presently preferred embodiment incorporating the principles of the invention.

Figure 2:
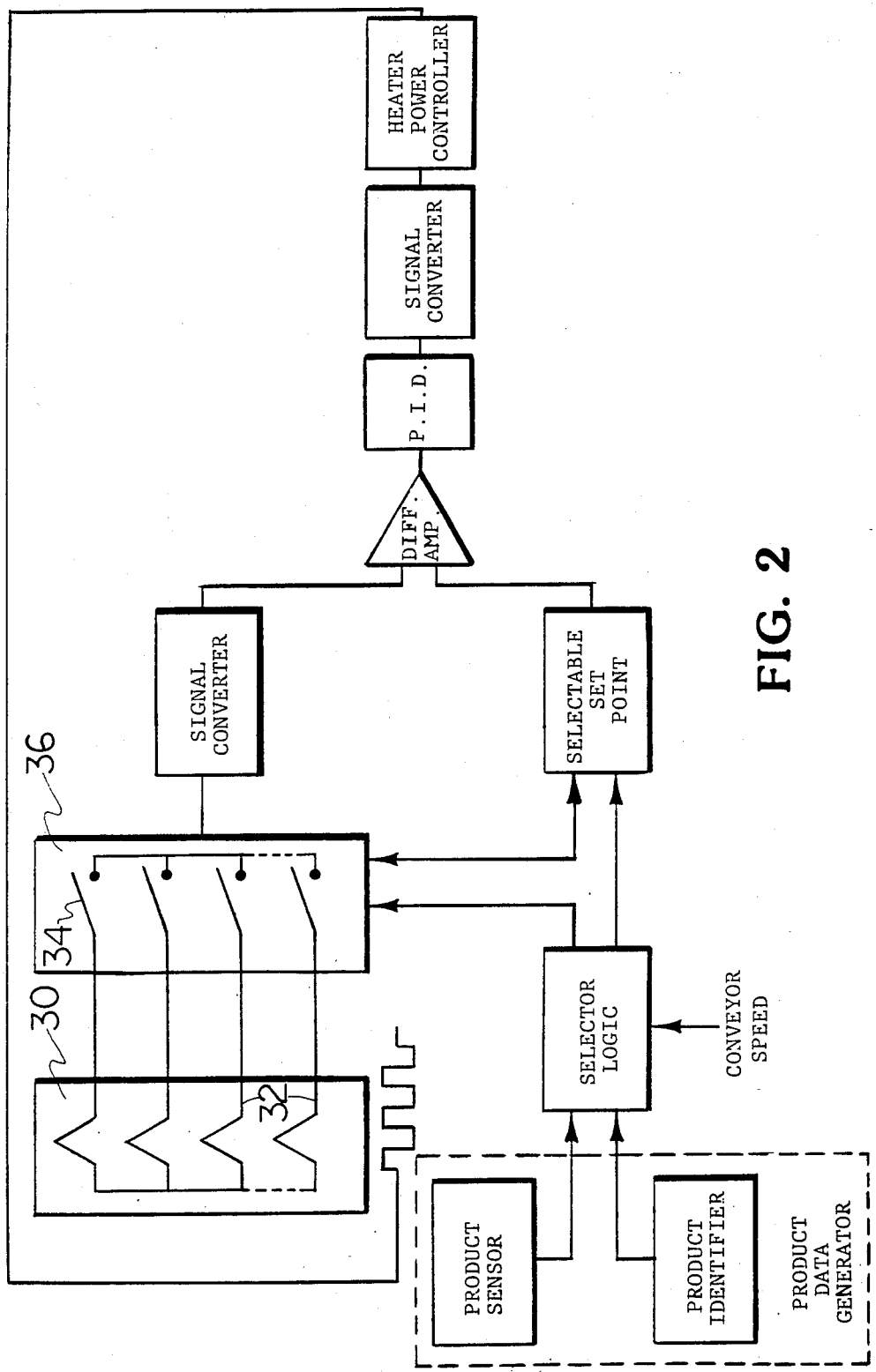

Referring to the drawings:

FIG. 1 is a cross-sectional view of a vapor phase system made in accordance with the teachings of the present invention; and FIG. 2 is a schematic diagram illustrating the structure for controlling the vapor level of the system shown in FIG. 1.

A vapor phase processing system includes a vessel or tank 10 which contains an electronic fluid 12. The contained electronic fluid 12 is heated by heaters 14 located within the electronic fluid 12 to generate a zone 16 of saturated vapor. Work product 18, which may have a variety of shapes, is placed on a conveyor 20 which carries the work product 18 through the inlet throat 22 to the saturated vapor zone 16 for processing and carries the processed work product 18 through the exit throat 24 to a pick up location.

A straight linear array of temperature sensors 30 in the form of discrete thermocouple elements 32 is inclined from the vertical to sense existing temperatures at specific spaced locations (here heights within the vessel 10). As can be seen from FIG. 2, each thermocouple 32 of the array 30 is connected to an associated switch 34 in a selectably setable height selector 36. The thermocouple array could be curvilinear, or could be linear extending horizontally or it could be two spaced thermocouples with the temperatrure at specific locations being defined by taking a selected weighted average. The height selector 36 is set by Selector Logic which operates on data received from a Product Data Generator which can include a Product Sensor for sensing work product at a specific position as it is conveyed through the system. The Product Sensor can, in its simplest form, be an optical switch operated when the work product interrupts a beam of light. The Product Data Generator may also include a Product Identifier which, in its simplest form, can be a thumb wheel switch manually setable to identify the specific work product being processed. A bar code reader might perform both of these functions. The Product Data Generator could also be an optical scanning array (not shown) which not only could sense the presence of the work product by locating its leading edge, but could also sense the trailing edge and top surface of the work product, thereby providing the Selector Logic directly with required dimensional data. The Selector Logic, based on this information, as well as on other information such as conveyor speed, determines the height of the vessel 10 at which the actual temperature is to be read (which thermocouple element is to be read) and when and sets the Selectable Set Point at the temperature which that thermocouple should sense if the saturated vapor zone has the desired minimum level for processing the work product. The output signal from the height selector 36 which is converted by a Signal Converter, is delivered with the Selectable Set Point signal to a difference amplifier which supplies a Proportional-Integrator-Derivative Controller (PID). The output of the PID, which is representative of a difference between the actual and desired temperatures at the selected vessel height and which is converted by a Signal Converter, is supplied to the Heater Power Controller to control heater power to eliminate any difference between the actual and desired temperatures at the selected vessel height. A larger work product 18A may require the elevation of the zone of saturated vapor to a higher level L.

What is claimed is:

1. A vapor processing system comprising:
    a vessel for containing a processing vapor,
    heater means for heating an electronic fluid contained within said vessel to establish a saturated vapor zone, said heater means having a variable output,
    means for conveying work product to the saturated vapor zone,
    means for defining a selected saturated vapor zone level for work product delivered to the vapor zone including
        selectively setable means for generating a signal representative of the actual temperature at one of at least a plurality of spaced locations,
        selectively setable means for generating a signal representative of the desired temperature at the selected location for a saturated vapor zone having a level selected for the work product being conveyed to the saturated vapor zone,
    means for generating data concerning product to be processed, and
    means operating on said data for setting said means for generating a signal representative of the actual temperature and for setting said means for generating a signal representative of the desired temperature at the selected location, and
    means for comparing the generated signals representative of the actual and desired temperatures at the selected location and for varying the output of said heater means to change the actual sensed temperature to the desired temperature so that the actual saturated vapor zone level will conform to the desired saturated vapor zone level.

2. A vapor processing system according to claim 1, wherein said means for generating data comprises
    means for sensing the presence of a work piece at a selected location, and
    means for identifying the product being conveyed to the saturated vapor zone.

3. A vapor processing system according to claim 2, wherein said means for sensing the actual temperature comprises a straight linear array of thermocouple elements.

4. A vapor processing system according to claim 3, wherein said array is inclined from the vertical.

* * * * *